United States Patent [19]
Beesley

[11] 4,373,139
[45] Feb. 8, 1983

[54] DETECTORS
[75] Inventor: Graham E. Beesley, Basingstoke, England
[73] Assignee: Motorola, Inc., Schaumburg, Ill.
[21] Appl. No.: 130,931
[22] Filed: Mar. 17, 1980
[30] Foreign Application Priority Data
Apr. 30, 1979 [GB] United Kingdom ................ 7914883
[51] Int. Cl.³ .................... G01R 19/02; G01R 19/22; G01R 23/09
[52] U.S. Cl. .................................. 307/350; 307/261; 307/351; 307/519
[58] Field of Search ............... 307/261, 350, 351, 519, 307/520; 330/278; 455/194, 136, 218, 219, 222, 223, 212; 328/151

[56] References Cited
U.S. PATENT DOCUMENTS
3,983,417 9/1976 Rheinfelder ......................... 307/350

Primary Examiner—John Zazworsky
Attorney, Agent, or Firm—Sang Ki Lee; James W. Gillman; Edward M. Eoney

[57] ABSTRACT

An averaging detector having a first transistor having a first resistor connected across the base and emitter, a first capacitor connected in a signal input line and to the base of a second transistor, the collectors of the first and second transistors being connected to a positive voltage line and the base of the first transistor being connected to an output voltage line, together with the emitter of the second transistor via a second resistor, an inhibit switch comprising a third transistor being connected between the base of the second transistor and a zero voltage line, a third resistor and second capacitor being connected in parallel between the zero voltage line and the output voltage line, the arrangement being such that on application of a voltage greater than the threshold voltage of the first transistor successive positive and negative cycles alternately reverse bias and forward bias the first and second transistors to achieve a balance between the half cycle charging through the second resistor and the continuous discharge through the third resistor to thereby provide a DC output proportional to the average input voltage waveform envelope.

2 Claims, 7 Drawing Figures

Transfer function of detector with threshold offset

DETECTORS

BACKGROUND OF THE INVENTION

This invention relates to detectors and particularly to an averaging detector.

An object of the invention is to provide an averaging detector with gain to provide a DC output proportional to the average input voltage waveform envelope.

The invention is particularly advantageous as the detector in the squelch circuit forming part of the noise blanking radio receiver described in co-pending U.S. Pat. application Ser. No. 129,927, filed on Mar. 3, 1980, and assigned to the same assignee to which the present application is assigned but the averaging detector of the present invention is applicable to any system requiring an averaging detector with gain such as in an AM, AGC radio.

SUMMARY OF THE INVENTION

According to the invention there is provided an averaging detector responsive to noise signals and responsive also to noise blanking signals produced in response to receipt of RF signals including noise signals, said averaging detector providing a DC output voltage proportional to the average level of the input voltage waveform envelope.

BRIEF DESCRIPTION OF THE DRAAWINGS

The invention will now be described by way of example with particular reference to the accompanying drawings wherein.

DETAILED DESCRIPTION OF THE INVENTION

Figure 1:
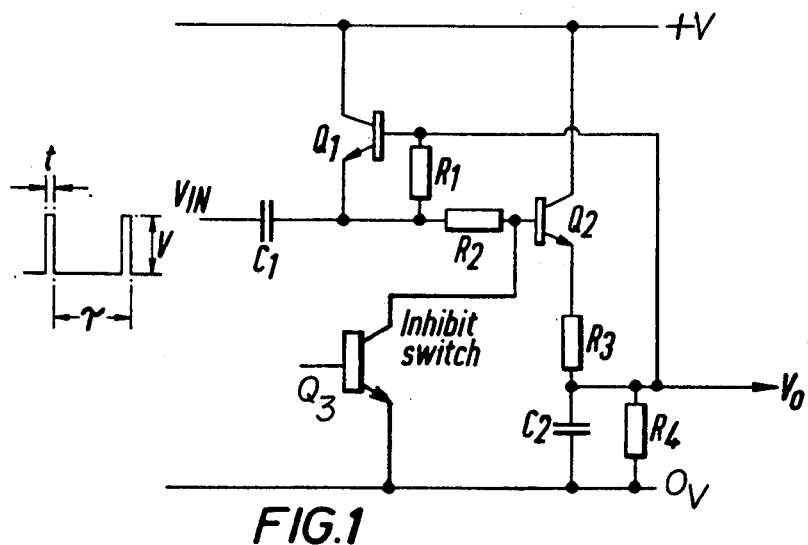
FIG. 1 is a detailed circuit of the averaging detector of the present invention.

Referring to FIG. 1, the averaging detector comprises an NPN transistor $Q_1$, a capacitor $C_1$ being connected in the $V_{IN}$ line and resistor $R_1$ being connected across the base and emitter of transistor $Q_1$. A resistor $R_2$ is connected in series with capacitor $C_1$ and to the base of a further NPN transistor $Q_2$. The collectors of transistors $Q_1$, $Q_2$ are connected to the positive voltage line +v and the base of transistor $Q_1$ is also connected to the output voltage line $V_o$. The emitter of transistor $Q_2$ is connected via resistor $R_3$ to the output voltage line $V_o$ and capacitor $C_2$ and resistor $R_4$ are connected in parallel between the OV line and the line $V_0$. An inhibit switch comprising a further NPN transistor $Q_3$ is connected between the base of transistor $Q_2$ and the OV line, and this is used for blanking, as described hereafter.

With the circuit in the quiescent state i.e. $V_o=0$, on application of a voltage greater than the threshold voltage $2V_{BE}$, the first positive going cycle of $V_{IN}$, reverse biases transistor $Q_1$ and forward biases transistor $Q_2$. The threshold voltage of $2V_{BE}$ is a peak-to-peak voltage as depicted by V in FIG. 1. No action will take place until $Q_2$ is turned on. No steady output will be achieved unless both $Q_1$ and $Q_2$ are being turned on alternately. This then gives a peak-to-peak threshold of $2V_{BE}$, that is, twice the base-emitter turn-on voltage of the transistors $Q_1$ and $Q_2$. The impedance seen by capacitor $C_1$ is high and mainly that of resistor $R_1$ and the full positive swing available is followed by the emitter of transistor $Q_2$ to charge capacitor $C_2$ through resistor $R_3$ forming a rectified average. As $V_{IN}$ goes negative, transistor $Q_2$ is reverse biased at a higher voltage than it became forward biased in the previous cycle due to the charging of capacitor $C_2$. Also transistor $Q_1$ becomes forward biased at a higher voltage for the same reason.

Upon application of a peak-to-peak voltage greater than $2V_{BE}$ at the input, the transistors $Q_1$ and $Q_2$ alternately conduct. During the negative half cycle of the input, the transistor $Q_1$ will conduct. The base of the transistor $Q_1$ is clamped at $V_O$, and, therefore, due to emitter follower action, $Q_1$ emitter is held at $V_O-V_{BE}$ by the low impedance of the emitter of the transistor $Q_1$. This causes the capacitor $C_1$ to charge during the negative peak input $(-V_{IN})$.

When the input goes to the positive half cycle $(+V_{IN})$, the potential at the emitter of the transistor $Q_1$ goes to $V_O-V_{BE}+2V_{IN}$. This voltage also appears at the base of the transistor $Q_2$. The emitter of the transistor $Q_2$ will follow this with an offset of its base emitter voltage $V_{BE}$ and has a potential of $V_O-V_{BE}+2V_{IN}-V_{BE}=V_O-2V_{BE}+2V_{IN}$.

This results in a further increase in the value of $V_O$. This bootstrap charging will continue until there is a dynamic balance due to the charging of the capacitor $C_2$ during the positive half cycle and the continuous discharging of the capacitor $C_2$ through the resistor $R_4$.

The resistor $R_2$ plays no active part in this process and is only present to allow the inhibit switch $Q_3$ effectively to inhibit the charging of the capacitor $C_2$ by the transistor $Q_2$ for a short period of time without upsetting the charge on the capacitors $C_1$ or $C_2$ causing excessive current flow in the transistor $Q_1$.

Figure 2A:
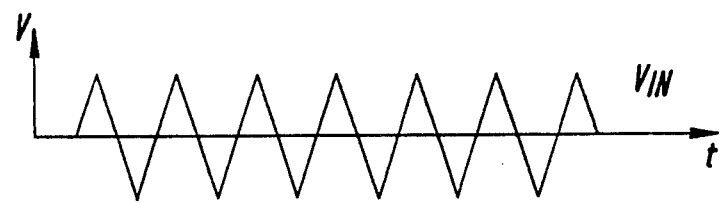
FIG. 2A to 2D are waveform diagrams of the signals present in the detector of FIG. 1.
Figure 2B:
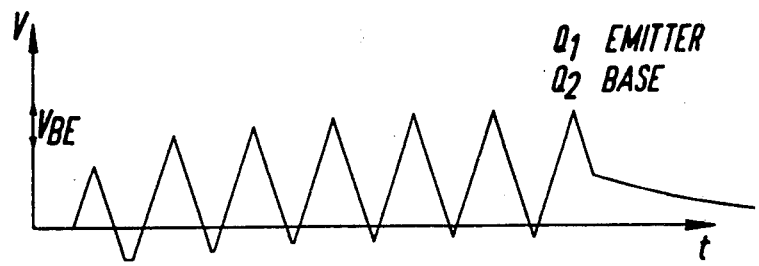
Figure 2C:
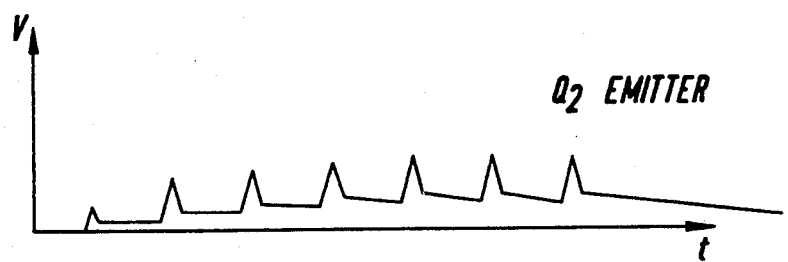
Figure 2D:
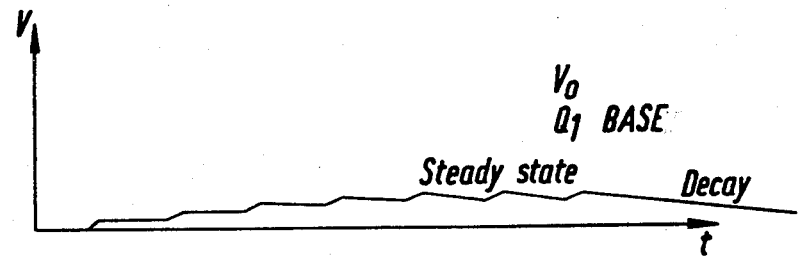

The circuit described above is an averaging detector and can be used as the detector in FM squelch, where it exhibits greater immunity to very short duration spikes or bursts, than a peak detector. This is graphically illustrated in FIG. 2A through 2D. Thus, with a triangular wave input voltage with peak-to-peak exceeding $2V_{BE}$, as shown in FIG. 2A, the averaging detector shown in FIG. 1 provides an averaged steady state output illustrated in FIG. 2D at the base of $Q_1$. Note that, as illustrated in FIG. 2B, the $Q_2$ base voltage follows the input voltage. But it has negative peaks, $V_{BE}$ below the output voltage. FIG. 2C shows the non-linear emitter follower action of $Q_2$ including the $V_{BE}$ threshold offset. However, the averaging detector described above has application in circuits other than the radio receiver circuit of the present invention and could be used as an AGC detector or as an AM detector.

In FIG. 1 $C_1R_1 >> \tau$
$C_2R_4 >> \tau$
$C_2R_3 >> \tau$ for averaging $$V_o = \frac{t}{\tau} \cdot \frac{R_4}{R_3} \cdot (V - 2V_{BE}) \text{ for } V - 2V_{BE} > 0$$

$$V_o = o \text{ for } V - 2V_{BE} \leq 0$$

where t is the pulse width and $\tau$ is the pulse period, as shown in the left side of FIG. 1.

Figure 3:
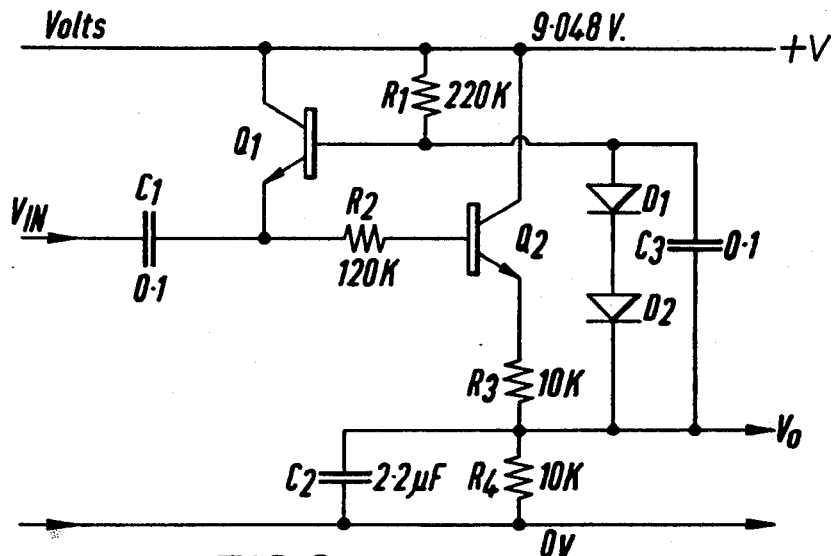
FIG. 3 is a detailed circuit diagram of a modified averaging detector with threshold voltage reduction.

In a modification of the circuit of FIG. 1, the threshold voltage can be reduced by offsetting the voltage on the base of transistor $Q_1$ by up to $2V_{BE}$ above $V_O$. One method using a pair of forward biased diodes is shown in FIG. 3. In this circuit resistor $R_1$ is connected between the base and collector of transistor $Q_1$ and a pair of forward biased diodes $D_1$, $D_2$, are connected between the base of transistor $Q_1$ and output line $V_O$, a capacitor $C_3$ being connected across diodes $D_1$, $D_2$.

Figure 4:
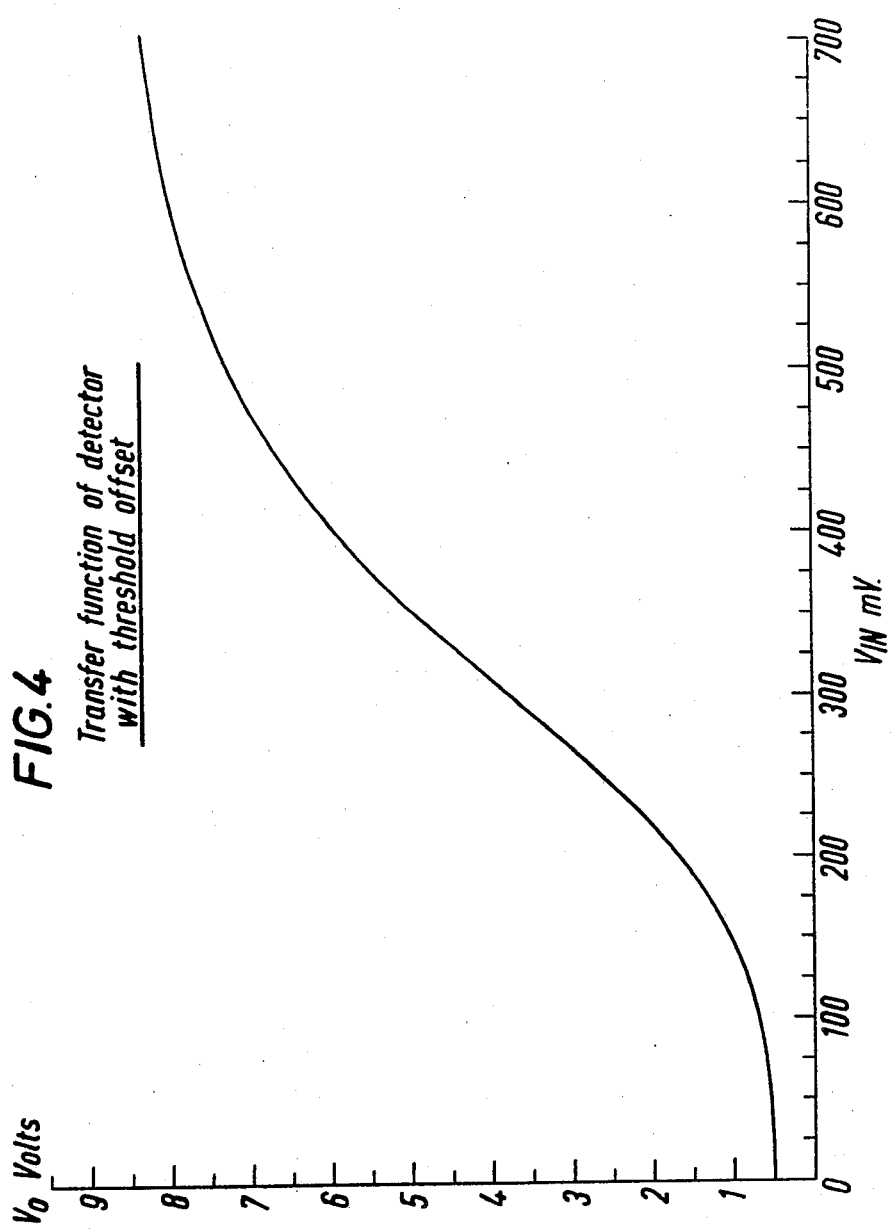
FIG. 4 is a graph of the transfer function of the averaging detector with threshold offset shown in FIG. 3 using sine wave input.

Referring now to FIG. 4, this figure is generally self-explanatory and shows the transfer characteristic of the embodiment of FIG. 3. In other words, the output potential $V_O$ of the circuit in volts is plotted against the value of the input potential $V_{IN}$ in millivolts. In this embodiment, the base of the transistor Q1 has a voltage offset due to the presence of the diodes D1 and D2 and the capacitor C3.

It should be noted that resistor $R_2$ is not an essential part of the circuit of FIG. 3, except when it is blanked by grounding the base of transistor $Q_2$. Resistor $R_2$ then prevents overload of transistor $Q_1$. The input time constant is defined by $R_2$ together with the transistor $Q_2$ input impedance. Capacitor $C_1$ should not approach the value of capacitor $C_2$ to maintain small charging currents in transistor $Q_1$.

I claim:

1. An averaging detector for detecting RF signals with noise pulses comprising:

input means;
output means;
a first transistor;
a first resistor coupled between the emitter and base of the first transistor;
a second transistor;
a first capacitor for applying the RF signals with noise to the emitter of said first transistor and the base of said second transistor;
a first reference potential line coupled to the collector of said first and said second transistors;
the output means being coupled to the base of said first transistor;
a second resistor coupled between the emitter of said second transistor and said output means;
a second reference potential line;
a second capacitor and a third resistor connected in parallel and interposed between said second reference potential line and said output means, wherein all of the aforementioned resistors, capacitors and transistors are so chosen that, upon application of a voltage greater than the threshold of said first transistor, successive positive and negative-going cycles in the RF signal alternately reverse bias and forward bias said first and second transistors to achieve a balance between the half cycle charging of the second capacitor through said second resistor and the continuous discharge of the second capacitor through said third resistor to provide a DC output voltage proportional to the average level of the waveform envelope of the RF signals at said input means.

2. An averaging detector for detecting RF signals with noise impulses comprising:

input means;
output means
a first reference potential line;
first transistor;
second transistor;
first resistor connected between the base of said first transistor and said first reference potential line;
first capacitor for applying the RF signals from said input means to the emitter of said first transistor and the base of said second transistor;
second resistor interposed between the emitter of said second transistor and the output means, the collector of said second transistor connected to the first reference potential line;
a second reference potential line;
second capacitor and third resistor coupled in parallel and interposed between said second reference potential line and said third resistor; and
diode means and third capacitor connected in parallel and interposed between the base of said first transistor and the output means, wherein all of the aforementioned resistors, capacitors, transistors and diode means are chosen such that the threshold voltage of said first transistor being reduced by offsetting the voltage on the base thereof and the said first and said second transistors being alternately reverse biased and forward biased on successive positive and negative-going cycles in the RF signal to achieve a balance between the half cycle charging of the second capacitor through said second resistor and the continuous discharge of the second capacitor through said third resistor to provide a DC output voltage proportional to the average level of the RF waveform envelope of the RF signals at said input means.

* * * * *